United States Patent
Jeon

(10) Patent No.: US 11,018,658 B1
(45) Date of Patent: May 25, 2021

(54) ELECTRONIC DEVICE AND OPERATING METHOD OF ELECTRONIC DEVICE

(71) Applicant: Samsung Electronics Co., Ltd., Suwon-si (KR)

(72) Inventor: Philjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/992,699

(22) Filed: Aug. 13, 2020

(30) Foreign Application Priority Data

Jan. 6, 2020 (KR) .................. 10-2020-0001641

(51) Int. Cl.
*H03K 5/135* (2006.01)
*H03K 5/05* (2006.01)
*H03K 5/08* (2006.01)
*H03K 5/00* (2006.01)

(52) U.S. Cl.
CPC .............. *H03K 5/135* (2013.01); *H03K 5/05* (2013.01); *H03K 5/084* (2013.01); *H03K 2005/00078* (2013.01); *H03K 2005/00234* (2013.01); *H03K 2005/00293* (2013.01)

(58) Field of Classification Search
None
See application file for complete search history.

(56) References Cited

U.S. PATENT DOCUMENTS

| | | |
|---|---|---|
| 8,878,792 B2 | 11/2014 | Lim et al. |
| 9,130,735 B2 | 9/2015 | Lee et al. |
| 9,137,008 B2 | 9/2015 | Wiley et al. |
| 9,496,879 B1 | 11/2016 | Duan et al. |
| 9,722,590 B1 | 8/2017 | Usugi et al. |
| 9,742,550 B1 | 8/2017 | Lugthart et al. |
| 10,128,964 B2 | 11/2018 | Wiley |
| 10,284,360 B2 | 5/2019 | Choi et al. |
| 10,298,381 B1 | 5/2019 | Lee et al. |
| 10,333,690 B1 | 6/2019 | Duan et al. |
| 2019/0149314 A1 | 5/2019 | Sengoku |

OTHER PUBLICATIONS

Yoshio Ando et al., Specification for C-PHY, Version 2.0, May 28, 2019, MIPI Board Adopted Sep. 9, 2019.

*Primary Examiner* — Thomas J. Hiltunen
(74) *Attorney, Agent, or Firm* — Muir Patent Law, PLLC

(57) ABSTRACT

An electronic device includes a unit interval detector including a plurality of delay cells and that receives a first signal, a second signal, and a third signal and detects a code indicating a unit interval from the first signal, the second signal, and the third signal, a clock recovery circuit that generates a clock signal from the first signal, the second signal, and the third signal in response to the code, and a data recovery circuit that generates a first receive signal, a second receive signal, and a third receive signal from the first signal, the second signal, and the third signal in response to the code and the clock signal. A total delay amount of the delay cells is smaller than a length of the unit interval and the unit interval detector performs a multi-stage detection operation including coarse detection and fine detection by using the delay cells.

20 Claims, 10 Drawing Sheets

ELECTRONIC DEVICE AND OPERATING METHOD OF ELECTRONIC DEVICE

CROSS-REFERENCE TO RELATED APPLICATIONS

This application claims priority under 35 U.S.C. § 119 to Korean Patent Application No. 10-2020-0001641 filed on Jan. 6, 2020, in the Korean Intellectual Property Office, the disclosure of which is incorporated by reference herein in their entireties.

BACKGROUND

Embodiments of the inventive concept described herein relate to an electronic device, and more particularly, relate to an electronic device recovering a clock signal from data including an embedded clock.

Various protocols are being used and developed to communicate data between different devices. Nowadays, C-PHY protocol is being developed as one of the protocols. The C-PHY is characterized in that a separate clock signal is not exchanged between different devices.

A C-PHY transmitter may combine a data signal and an embedded clock and may transmit the combined signals. A C-PHY receiver is configured to recover a clock signal from received signals and to recover data from the received signals by using the clock signal.

A plurality of delay units may be used to recover the clock signal from the received signals. As a frequency range allowable by the C-PHY increases, the number of delay units necessary for the receiver of the C-PHY increases. The increase in the number of delay units may cause an increase in the size of the C-PHY receiver and a related increase in costs.

SUMMARY

Embodiments of the inventive concept provide an electronic device recovering a clock signal by using a decreased number of delay units and an operating method of the electronic device.

According to an exemplary embodiment, an electronic device includes a unit interval detector including a plurality of delay cells and that receives a first signal, a second signal, and a third signal and detects a code indicating a unit interval from the first signal, the second signal, and the third signal, a clock recovery circuit that generates a clock signal from the first signal, the second signal, and the third signal in response to the code, and a data recovery circuit that generates a first receive signal, a second receive signal, and a third receive signal from the first signal, the second signal, and the third signal in response to the code and the clock signal. A total delay amount of the delay cells is smaller than a length of the unit interval and the unit interval detector performs a multi-stage detection operation including coarse detection and fine detection by using the delay cells.

According to an exemplary embodiment, an electronic device includes a first delay cell that includes a first delay unit and at least one second delay unit sequentially connected, receives a first signal being toggled between a high level and a low level and delays the first signal so as to be output as a second signal, a second delay cell that includes at least two third delay units sequentially connected, receives the second signal from the first delay cell, and delays the second signal so as to be output as a third signal, a counter that performs a count operation in synchronization with the third signal and outputs a first code as a result of the count operation, a first decision block that is connected to the first delay cell, detects, in synchronization with a falling edge of the first signal, either a rising or a falling edge of a first internal signal from the first delay cell, and outputs a first bit as a detection result of either the rising or the falling edge of the first internal signal, a second decision block that is connected to the second delay cell, detects, in synchronization with a falling edge of the first signal, either a rising or a falling edge of a second internal signal from the second delay cell, and outputs a second bit as a detection result of either the rising or the falling edge of the second internal signal, and an encoder that generates a second code from the first bit and the second bit. The second signal is fed back to the first delay unit through an inverter.

According to an exemplary embodiment, an operating method of an electronic device includes receiving a first signal being toggled between a high level and a low level, in response to the first signal, generating a second signal being toggled between the high level and the low level at a period shorter than a period of the first signal, counting a number of times that the second signal passes through a delay loop including first delay cells and second delay cells while the first signal is at the high level and generating a first code as a result of the counting, detecting a location on the delay loop, at which either a rising or a falling edge of the second signal exists, in synchronization with a falling edge of the first signal and generating a second code as a result of the detecting, and combining the first code and the second code and generating a third code as a result of the combining.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Figure 1:
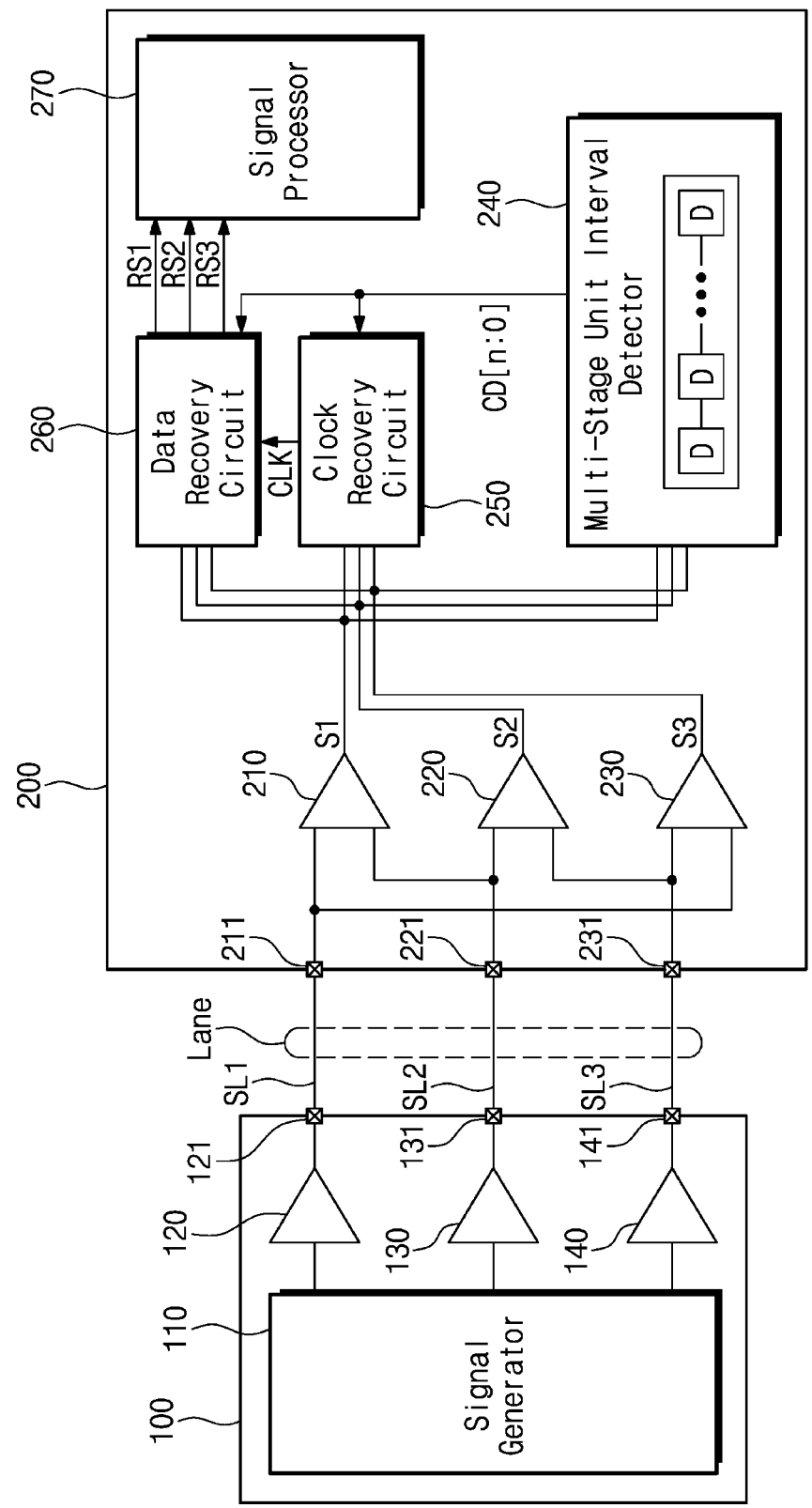
FIG. 1 illustrates an electronic device system according to an embodiment of the inventive concept.

FIG. 1 illustrates an electronic device system according to an embodiment of the inventive concept. Referring to FIG. 1, an electronic device system may include a first electronic device 100 and a second electronic device 200.

The first electronic device 100 may transmit signals to the second electronic device 200 through a first signal line SL1, a second signal line SL2, and a third signal line SL3. The first signal line SL1, the second signal line SL2, and the third signal line SL3 may form one lane and may transfer signals transitioning (or being toggled) in connection with each other.

The first electronic device 100 may include a signal generator 110, a first transmitter 120, a second transmitter 130, and a third transmitter 140. The signal generator 110 may generate signals to be transferred through the first signal line SL1, the second signal line SL2, and the third signal line SL3.

The first transmitter 120, the second transmitter 130, and the third transmitter 140 may be respectively connected to the first signal line SL1, the second signal line SL2, and the third signal line SL3 through a first terminal 121, a second terminal 131, and a third terminal 141.

The first transmitter 120, the second transmitter 130, and the third transmitter 140 may transmit signals in compliance with one of various communication protocols. For example, the first transmitter 120, the second transmitter 130, and the third transmitter 140 may transmit signals in compliance with a protocol of the C-PHY including C-PHY v2.0 defined by the mobile industry processor interface (MIPI). MIPI C-PHY is an embedded clock link that provides extreme flexibility to reallocate lanes within a link. It also offers low-latency transitions between high-speed and low-power modes. C-PHY accomplishes this by departing from a conventional differential signaling technique on two-wire lanes and introducing three-phase symbol encoding of about 2.28 bits/symbol, to transmit data symbols on three-wire lanes, or "trios," where each trio includes an embedded clock. Three trios operating at 6 Gsym/s achieve a peak data rate of about 41 Gbps over a nine-wire interface.

The second electronic device 200 may receive signals through the first signal line SL1, the second signal line SL2, and the third signal line SL3. The second electronic device 200 may include a first receiver 210, a second receiver 220, a third receiver 230, a multi-stage unit interval detector 240, a clock recovery circuit 250, a data recovery circuit 260, and a signal processor 270.

The first receiver 210, the second receiver 220, and the third receiver 230 may respectively receive signals from the first signal line SL1, the second signal line SL2, and the third signal line SL3 through a first terminal 211, a second terminal 221, and a third terminal 231. The first receiver 210 may output a difference between the signal received from the first signal line SL1 through the first terminal 211 and the signal received from the second signal line SL2 through the second terminal 221 as a first signal S1.

The second receiver 220 may output a difference between the signal received from the second signal line SL2 through the second terminal 221 and the signal received from the third signal line SL3 through the third terminal 231 as a second signal S2. The third receiver 230 may output a difference between the signal received from the third signal line SL3 through the third terminal 231 and the signal received from the first signal line SL1 through the first terminal 211 as a third signal S3.

The multi-stage unit interval detector 240 may receive the first signal S1, the second signal S2, and the third signal S3. The multi-stage unit interval detector 240 may detect a unit interval from the first signal S1, the second signal S2, and the third signal S3. For example, the unit interval may be an interval where each of the first signal S1, the second signal S2, and the third signal S3 includes one symbol.

For example, based on the C-PHY protocol, the first transmitter 120, the second transmitter 130, and the third transmitter 140 may have a preamble interval before transmitting symbols including data. In the preamble interval, the first transmitter 120, the second transmitter 130, and the third transmitter 140 may transmit signals for detection of the unit interval.

The multi-stage unit interval detector 240 may detect the unit interval from the first signal S1, the second signal S2, and the third signal S3 during the preamble interval. The multi-stage unit interval detector 240 may include a plurality of delay units "D". Hereinafter, the plurality of delay units "D" may include one first delay unit D' and second delay units "D" that are connected in series. As used herein, a "unit" may refer to a "circuit". The multi-stage unit interval detector 240 may detect the unit interval by using the plurality of delay units "D". The multi-stage unit interval detector 240 may output a code [n:0] as information about a length of the unit interval. The code [n:0] may have a resolution of (n+1) bits.

In an embodiment, a total delay amount of the delay units "D" may be shorter than a length of the unit interval. The multi-stage unit interval detector 240 may be implemented in a multi-stage structure in which delay units including a coarse detection stage, of which a total delay amount is shorter than the length of the unit interval, and a fine detection stage. The multi-stage unit interval detector 240 may generate the code [n:0] based on the multi-stage structure of the delay units "D".

The clock recovery circuit 250 may receive the first signal S1, the second signal S2, the third signal S3, and the code [n:0]. The clock recovery circuit 250 may recover a clock signal CLK from the first signal S1, the second signal S2, and the third signal S3 by using the code [n:0].

Based on the C-PHY protocol, the first transmitter 120, the second transmitter 130, and the third transmitter 140 may transmit signals including data, with a clock signal combined in the signals. The combined clock signal may include an embedded clock. The embedded clock may also appear at the first signal S1, the second signal S2, and the third signal S3.

In each unit interval, the clock recovery circuit 250 may allow the clock signal CLK to transition to a high level as one of the first signal S1, the second signal S2, and the third signal S3 transitions. Afterwards, when the remaining signals of the first signal S1, the second signal S2, and the third signal S3 transition in the same symbol interval, the clock recovery circuit 250 may maintain the level of the clock signal CLK without a transition of the clock signal CLK.

For example, the clock recovery circuit 250 may identify the length of the unit interval, for example, 1 UI (Unit Interval) from the code [n:0]. The clock recovery circuit 250 may maintain the level of the clock signal CLK by masking the clock signal CLK during a given time within a range from 0.3 UI to 0.6 UI after the clock signal CLK transitions in each unit interval.

After the given time elapses, the clock recovery circuit 250 may allow the clock signal CLK to transition to a low level. That is, the clock recovery circuit 250 may generate the clock signal CLK, of which a period corresponds to the unit interval.

The data recovery circuit 260 may receive the first signal S1, the second signal S2, the third signal S3, and the code [n:0]. The data recovery circuit 260 may delay the first signal S1, the second signal S2, and the third signal S3 based on the code [n:0]. For example, the data recovery circuit 260 may adjust a delay amount so as to make it easy to latch the first signal S1, the second signal S2, and the third signal S3. For example, the delay amount may be 0.5 UI or a value similar thereto.

The data recovery circuit 260 may respectively latch the delayed first signal S1, the delayed second signal S2, and the delayed third signal S3 in synchronization with the clock signal CLK. The data recovery circuit 260 may output the latched results as a first receive signal RS1, a second receive signal RS2, and a third receive signal RS3.

The signal processor 270 may receive the first receive signal RS1, the second receive signal RS2, and the third receive signal RS3. The signal processor 270 may operate in response to the first receive signal RS1, the second receive signal RS2, and the third receive signal RS3.

In an embodiment, the first electronic device 100 may be an application processor (AP), and the second electronic device 200 may be a display device. For another example, the first electronic device 100 may be an image sensor, and the second electronic device 200 may be an application processor (AP).

One lane including the first signal line SL1, the second signal line SL2, and the third signal line SL3 is illustrated in FIG. 1. However, the first electronic device 100 and the second electronic device 200 may communicate with each other through two or more lanes.

Figure 2:
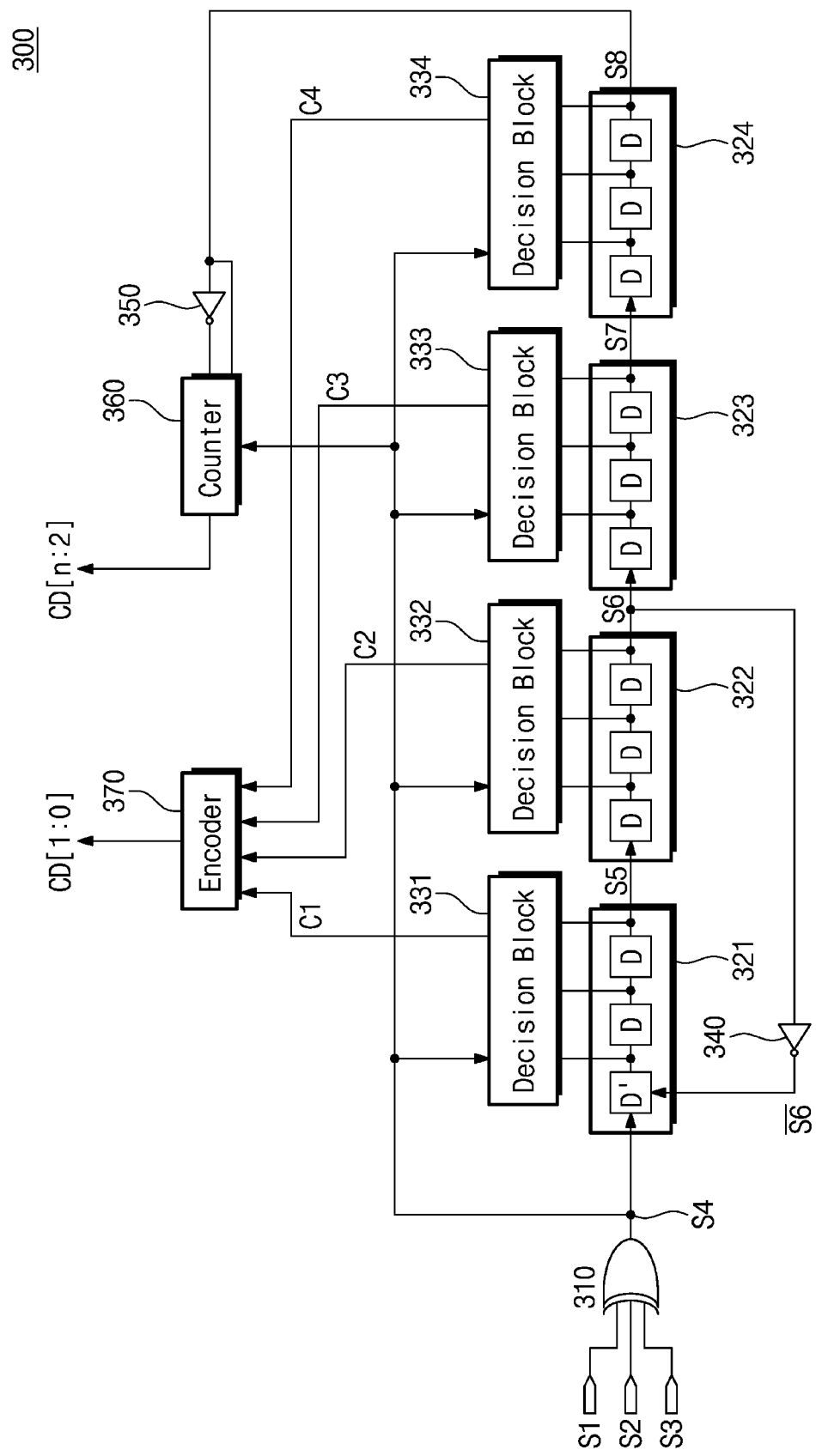
FIG. 2 illustrates a multi-stage unit interval detector according to an embodiment of the inventive concept.

FIG. 2 illustrates a multi-stage unit interval detector 300 according to an embodiment of the inventive concept. The multi-stage unit interval detector 300 may be the multi-stage unit interval detector 240 of FIG. 1. Referring to FIGS. 1 and 2, the multi-stage unit interval detector 300 may include a logic gate 310, first to fourth delay cells 321 to 324, first to fourth decision blocks 331 to 334, a first inverter 340, a second inverter 350, a counter 360, and an encoder 370.

The logic gate 310 may receive the first signal S1, the second signal S2, and the third signal S3. The logic gate 310 may perform an exclusive OR operation on the first signal S1, the second signal S2, and the third signal S3. For example, the logic gate 310 may perform an operation during the preamble interval.

The logic gate 310 may output a result of the operation as a fourth signal S4. For example, the fourth signal S4 may be in the form of a clock signal that is periodically toggled (or transitions) between a high level and a low level.

The first delay cell 321 may receive the fourth signal S4. The first delay cell 321 may include one first delay unit D' and two second delay units "D" that are sequentially arranged or sequentially connected. The first delay unit D' may generate an internal clock signal having a period shorter than a period of the fourth signal S4, in response to the fourth signal S4. A toggle timing (e.g., a first toggle timing) of the internal clock signal may be delayed with respect to a toggle timing (e.g., a first toggle timing) of the fourth signal S4.

The first delay unit D' may receive the fourth signal S4 and an inverted version of a sixth signal S6 (i.e., a signal generated by inverting the sixth signal S6 through the first inverter 340).

The first delay unit D' may output the internal clock signal of a low level while the fourth signal S4 is at the high level and the inverted version of the sixth signal S6 is at the low level. The first delay unit D' may output the internal clock signal of the high level when the fourth signal S4 is at the high level and the inverted version of the sixth signal S6 is at the high level.

The two second delay units "D" of the first delay cell 321 may delay and output internal clock signals. The first delay cell 321 may output the delayed signal as a fifth signal S5. The second delay cell 322 may receive the fifth signal S5. The second delay cell 322 may include three second delay units "D" that are sequentially arranged or sequentially connected. The second delay cell 322 may output a delayed signal as the sixth signal S6. The sixth signal S6 may be fed back to the first delay unit D' of the first delay cell 321.

The third delay cell 323 may receive the sixth signal S6. The third delay cell 323 may include three second delay units "D" that are sequentially arranged or sequentially connected. The third delay cell 323 may output a delayed signal as a seventh signal S7. The fourth delay cell 324 may receive the seventh signal S7. The fourth delay cell 324 may include three second delay units "D" that are sequentially arranged or sequentially connected. The fourth delay cell 324 may output a delayed signal as an eighth signal S8.

The first decision block 331 may receive outputs of the first delay unit D' and the two second delay units "D" of the first delay cell 321. The first decision block 331 may perform decision in synchronization with the fourth signal S4. The first decision block 331 may determine whether a rising edge of the internal clock signal is present in the first delay cell 321, at a decision time point.

When it is determined that the rising edge of the internal clock signal is present in the first delay cell 321 at the decision time point, the first decision block 331 may output a first code signal C1 of logic "1". When it is determined that the rising edge of the internal clock signal is absent from the first delay cell 321 at the decision time point, the first decision block 331 may output the first code signal C1 of logic "0".

The second decision block 332 may receive outputs of the three second delay units "D" of the second delay cell 322. Like the first decision block 331, the second decision block 332 may determine whether the rising edge of the internal clock signal is present in the second delay cell 322 at the decision time point in synchronization with the fourth signal S4 and may output a second code signal C2 as a result of the determination.

The third decision block 333 may receive outputs of the three second delay units "D" of the third delay cell 323. Like the first decision block 331, the third decision block 333 may determine whether the rising edge of the internal clock signal is present in the third delay cell 323 at the decision time point in synchronization with the fourth signal S4 and may output a third code signal C3 as a result of the determination.

The fourth decision block 334 may receive outputs of the three second delay units "D" of the fourth delay cell 324. Like the first decision block 331, the fourth decision block 334 may determine whether the rising edge of the internal clock signal is present in the fourth delay cell 324 at the decision time point in synchronization with the fourth signal S4 and may output a fourth code signal C4 as a result of the determination.

The second inverter 350 may invert the eighth signal S8, and an output of the second inverter 350 may be output to the counter 360. The counter 360 may perform a count operation in synchronization with the output of the second inverter 350, for example, a rising edge thereof. In some examples, the counter 360 may perform a count operation in synchronization with the eighth signal S8. The counter 360 may receive the fourth signal S4. The counter 360 may perform the count operation while the fourth signal S4 is at the high level.

The counter 360 may output a count value as a first code CD[n:2] in synchronization with a falling edge of the fourth signal S4. The first code CD[n:2] may include information about the number of times that the internal clock signal passes through the first to fourth delay cells 321 to 324. The first code CD[n:2] may be a result of coarse detection and may be composed of consecutive bits including the most significant bit MSB (e.g., C[n]) from among bits of the code [n:0].

The encoder 370 may receive the first to fourth code signals C1 to C4 from the first to fourth decision blocks 331 to 334. The encoder 370 may generate a second code CD[1:0] from the first to fourth code signals C1 to C4. For example, when the number of delay cells is more than $2^{i-1}$ and is equal to or less than $2^i$, a second code may be composed of "i" bits.

Because the first to fourth delay cells 321 to 324 are illustrated in FIG. 2, the second code CD[1:0] may be composed of two bits. At a time point of the falling edge of the fourth signal S4 (e.g., the decision time point), the second code CD[1:0] may include location information of the rising edge of the internal clock signal, for example, information about a delay cell, in which the rising edge of the internal clock signal exists, from among the first to fourth delay cells 321 to 324.

The second code CD[1:0] may be a result of fine detection. The second code CD[1:0] may be composed of consecutive bits including the least significant bit LSB from among bits of the code [n:0].

As described above, the multi-stage unit interval detector 240 generates the internal clock signal having a period shorter than a period of an input clock signal (e.g., the fourth signal S4) by forming a feedback loop by using one (i.e., a middle signal) of output signals of the delay cells 321 to 324. The multi-stage unit interval detector 240 may perform the coarse detection by counting the number of times that the internal clock signal passes through the first to fourth delay cells 321 to 324.

Also, the multi-stage unit interval detector 240 may perform the fine detection by detecting a location of the rising edge of the internal clock signal from the first to fourth delay cells 321 to 324 at the decision time point.

An example is illustrated in FIG. 2 as the number of delay cells is "4" and the number of decision blocks is "4", but the inventive concept is not limited thereto. For example, the number of delay cells and the number of decision blocks may be variously modified or changed. Each of the number of delay cells and the number of decision blocks may be fixed to "24" based on a characteristic of the C-PHY protocol having a variable range from 1 GHz to 6 GHz. In an embodiment, the number of delay cells belonging to a front stage of a signal included in the feedback loop may be equal to the number of delay cells belonging to a rear stage of the signal.

In an embodiment, the multi-stage unit interval detector 240 may be interpreted as including a first delay cell (or delay cell group) that receives the fourth signal S4 and includes sub delay cells (e.g., the first and second delay cells 321 and 322) and a second delay cell (or delay cell group) that receives the sixth signal S6 and includes sub delay cells (e.g., the third and fourth delay cells 323 and 324).

Considering that the number of times that the internal clock signal passes through the first to fourth delay cells 321 to 324 is counted by the counter 360, the first to fourth delay cells 321 to 324 may be interpreted as forming one delay loop.

An embodiment is illustrated as the counter 360 performs a count operation in synchronization with the falling edge of the eighth signal S8 as the inverter 350 is provided. Alternatively, an odd number of inverters may be added between the counter 360 and the fourth delay cell 324. However, as an option, the inverter 350 of the multi-stage unit interval detector 300 may be omitted (or removed). For example, the counter 360 may perform a count operation in synchronization with the rising edge of the eighth signal S8 when the inverter 350 between the counter 360 and the fourth delay cell 324 is omitted.

In some examples, the counter 360 may output a count value as a first code CD[n:2] as a result of the count operation in response to the eighth signal S8 when the second code CD[1:0] is generated from the first and second code signals C1 and C2. In some examples, the counter 360 may output a count value as a first code CD[n:2] as a result of the count operation in response to the output of the second inverter 350 when the second code CD[1:0] is generated from the first and second code signals C1 and C2.

Figure 3:
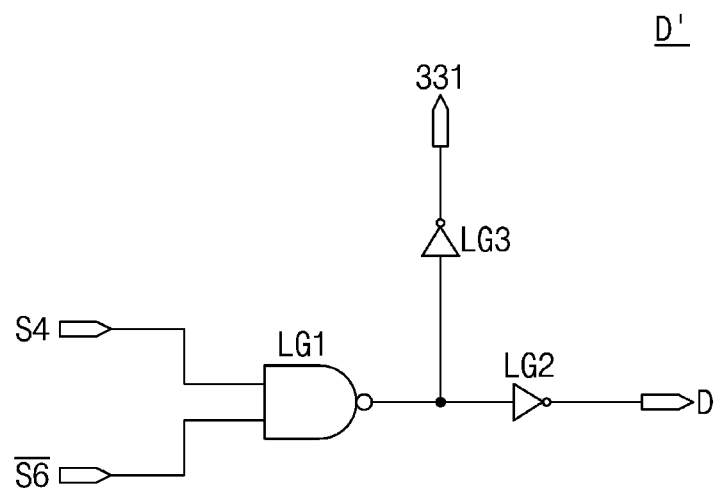
FIG. 3 illustrates a first delay unit according to an embodiment of the inventive concept.

FIG. 3 illustrates the first delay unit D' according to an embodiment of the inventive concept. Referring to FIGS. 2 and 3, the first delay unit D' may include a first logic gate LG1, a second logic gate LG2, and a third logic gate LG3.

The first logic gate LG1 may perform a NAND operation on an output of the first inverter 340 and the fourth signal S4. That is, the first logic gate LG1 may output the low level when the fourth signal S4 is at the high level and the sixth signal S6 is at the low level.

Each of the second logic gate LG2 and the third logic gate LG3 may be an inverter. An output of the second logic gate LG2 may be output to the second delay unit "D" of the first delay cell 321, and an output of the third logic gate LG3 may be output to the first decision block 331.

Figure 4:
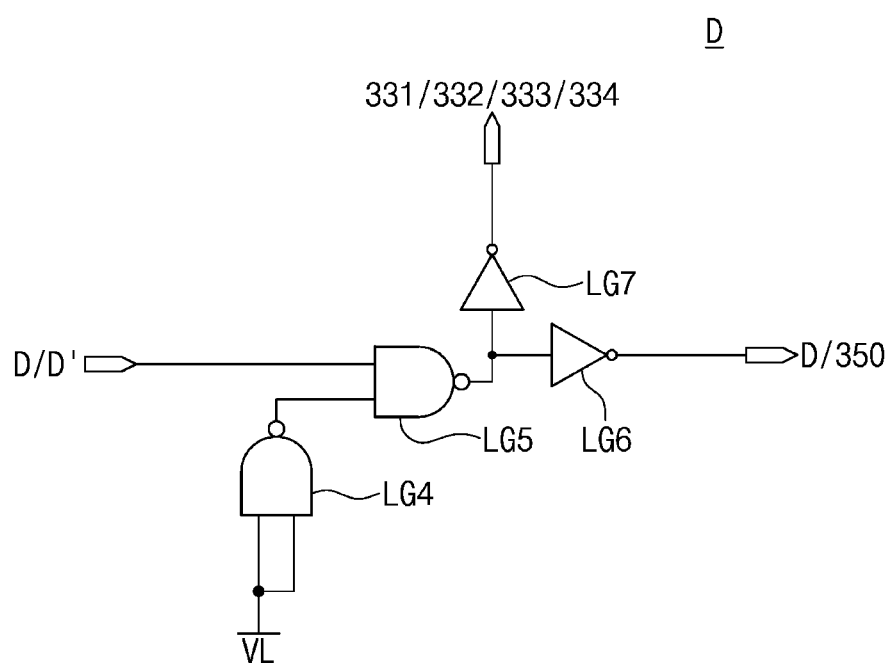
FIG. 4 illustrates a second delay unit according to an embodiment of the inventive concept.

FIG. 4 illustrates the second delay unit "D" according to an embodiment of the inventive concept. Referring to FIGS. 2 and 4, the second delay unit "D" may include a fourth logic gate LG4, a fifth logic gate LG5, a sixth logic gate LG6, and a seventh logic gate LG7.

The fourth logic gate LG4 may perform a NAND operation on low levels VL. That is, the fourth logic gate LG4 may output the high level. The fifth logic gate LG5 may perform a NAND operation on the output of the fourth logic gate LG4, that is, the high level and an output of the first delay unit D' or the second delay unit "D".

When the output of the first delay unit D' or the second delay unit "D" is at the low level, the fifth logic gate LG5 may output the high level. When the output of the first delay unit D' or the second delay unit "D" is at the high level, the fifth logic gate LG5 may output the low level.

Each of the sixth logic gate LG6 and the seventh logic gate LG7 may be an inverter. An output of the sixth logic gate LG6 may be output to a corresponding delay unit "D" or the second inverter 350, and an output of the seventh logic gate LG7 may be output to a corresponding decision block of the first to fourth decision blocks 331 to 334.

Figure 5:
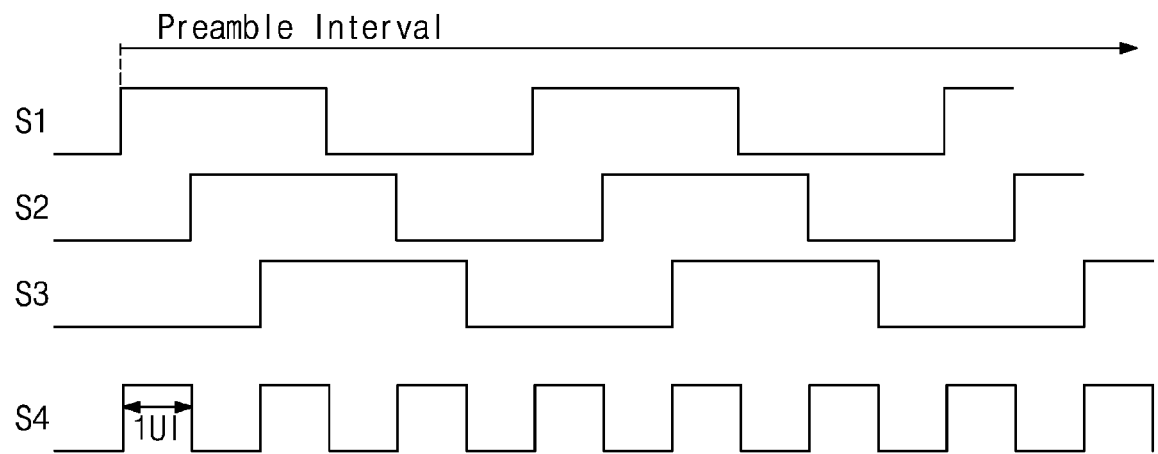
FIG. 5 illustrates an example of a first signal, a second signal, and a third signal.

FIG. 5 illustrates an example of the first signal S1, the second signal S2, and the third signal S3. Referring to FIGS. 2 and 5, only one of the first signal S1, the second signal S2, and the third signal S3 transitions in one unit interval UI during the preamble interval. Also, as the unit interval UI is repeated, the first signal S1, the second signal S2, and the third signal S3 alternately transition.

The fourth signal S4 is a result of performing an exclusive OR operation an example of the first signal S1, the second signal S2, and the third signal S3. The fourth signal S4 may be in the form of a clock signal, of which half a period corresponds to one unit intervals UI.

Figure 6:
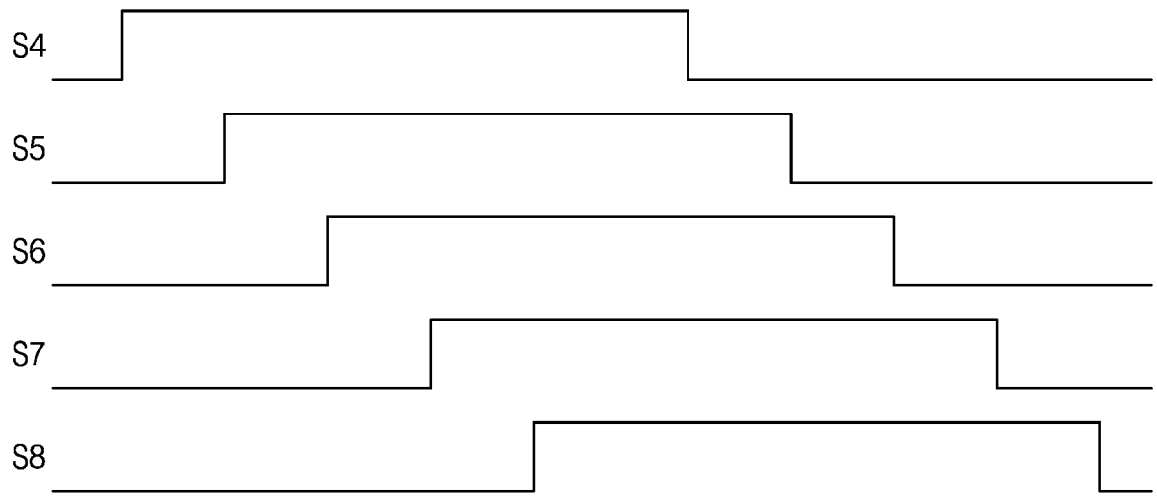
FIG. 6 illustrates shapes of fourth to eighth signals when a feedback loop of a sixth signal does not exist.

FIG. 6 illustrates shapes of the fourth to eighth signals S4 to S8 when a feedback loop of the sixth signal S6 does not exist. Referring to FIGS. 2 and 6, when a feedback loop of the sixth signal S6 does not exist, the fifth signal S5 may be delayed with respect to the fourth signal S4 as much as a total delay amount of three delay units (i.e., one first delay unit D' and two second delay units "D").

When the feedback loop of the sixth signal S6 does not exist, the sixth signal S6 may be delayed with respect to the fifth signal S5 as much as a total delay amount of three delay units (i.e., three second delay units "D"), the seventh signal S7 may be delayed with respect to the sixth signal S6 as much as a total delay amount of three delay units (i.e., three second delay units "D"), and the eighth signal S8 may be delayed with respect to the seventh signal S7 as much as a total delay amount of three delay units (i.e., three second delay units "D").

Figure 7:
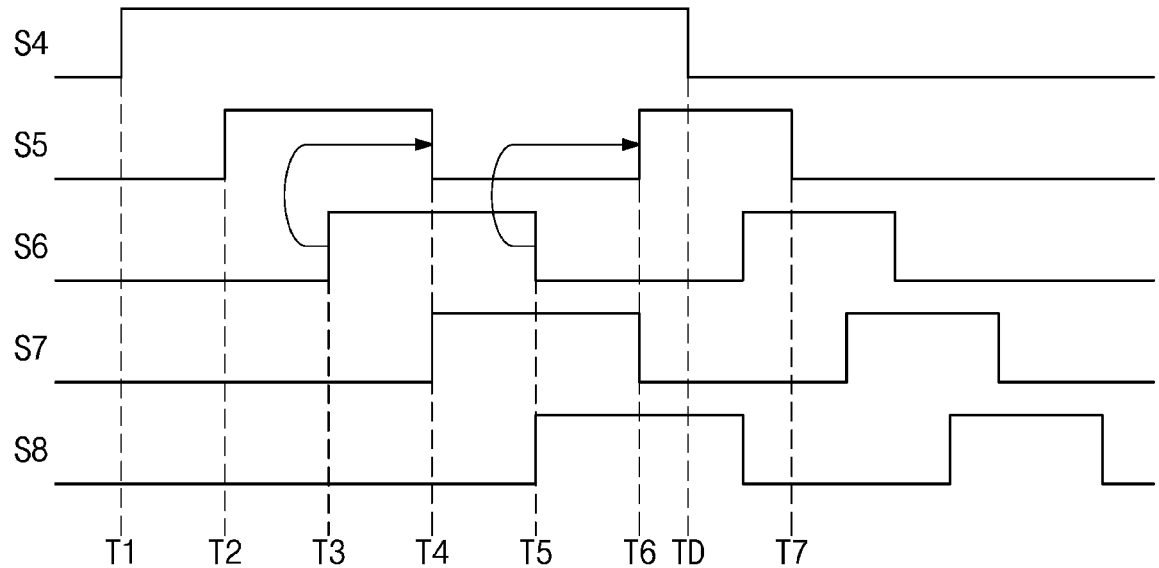
FIG. 7 illustrates an example of fourth to eighth signals of a multi-stage unit interval detector including a feedback loop of a sixth signal.

FIG. 7 illustrates an example of the fourth to eighth signals S4 to S8 of the multi-stage unit interval detector 240 including a feedback loop of the sixth signal S6. Referring to FIGS. 2 and 7, at a first time T1, the rising edge of the fourth signal S4 may occur. The first delay unit D' may receive the sixth signal S6 of the low level through the inverter 340 and the fourth signal S4 of the high level and may output the high level.

A rising edge may occur in the fifth signal S5 at a second time T2 that is delayed with respect to the first time T1 as much as a total delay amount of three delay units (i.e., one first delay unit D' and two second delay units "D").

A rising edge may occur in the sixth signal S6 at a third time T3 that is delayed with respect to the second time T2 as much as a total delay amount of three delay units (i.e., three second delay units "D"). The rising edge of the sixth signal S6 may be fed back through the inverter 340 to the first delay unit D' of the first delay cell 321. The first delay unit D' of the first delay cell 321 may output the low level in response to the rising edge of the sixth signal S6 of the third time T3.

A falling edge may occur in the fifth signal S5 at a fourth time T4 that is delayed with respect to the third time T3 as much as a total delay amount of three delay units (i.e., one first delay unit D' and two second delay units "D"). A falling edge may occur in the sixth signal S6 at a fifth time T5 that is delayed with respect to the fourth time T4 as much as a total delay amount of three delay units (i.e., three second delay units "D").

The falling edge of the sixth signal S6 may be fed back through the inverter 340 to the first delay unit D' of the first delay cell 321. The first delay unit D' of the first delay cell 321 may output the high level in response to the falling edge of the sixth signal S6 of the fifth time T5. A rising edge may occur in the fifth signal S5 at a sixth time T6 that is delayed with respect to the fifth time T5 as much as a total delay amount of three delay units (i.e., one first delay unit D' and two second delay units "D").

For example, the fifth signal S5 may be in the form of an internal clock signal being toggled between the high level and the low level with a period shorter than a period of the fourth signal S4. The sixth signal S6, the seventh signal S7, and the eighth signal S8 may be generated by sequentially delaying the internal clock signal being the fifth signal S5.

The falling edge of the fifth signal S5 occurring at a seventh time T7 may reflect the falling edge of the fourth signal S4. The first delay unit D' may generate the internal clock signal that transitions between the high level and the low level with a period shorter than that of the fourth signal S4 while the fourth signal S4 is at the high level.

When the feedback loop is formed by using the middle of the first to fourth delay cells 321 to 324, for example, by using the sixth signal S6, a period of the internal clock signal may be identical or similar to a total delay amount of the first to fourth delay cells 321 to 324.

The falling edge of the fourth signal S4 may be a decision time point "TD". At the decision time point "TD", the multi-stage unit interval detector 240 may output a result of coarse detection by outputting a count value of the counter 360 as the first code CD[n:2]. At the decision time point TD, the multi-stage unit interval detector 240 may output a result of fine detection by outputting an encoding value of the encoder 370 as the second code CD[1:0]. In some examples, the encoder 370 may be an adder.

When the inverter 350 exists, the counter 360 may perform a count-up operation CNTU in synchronization with a falling edge of the eighth signal S8. Accordingly, at the decision time point TD, the first code CD[n:2] may indicate a value of "0". The first code CD[n:2] of "0" may mean that the code [n:0] may be generated by one of first to fourth decision blocks 331 to 334.

When the inverter 350 does not exist, the counter 360 may perform a count-up operation in synchronization with a rising edge of the eighth signal S8. Accordingly, at the decision time point TD, the first code CD[n:2] may indicate a value of "0". The first code CD[n:2] of "0" may mean that the rising edge of the fourth signal S4 passes through 4 delay cells.

Figure 8:
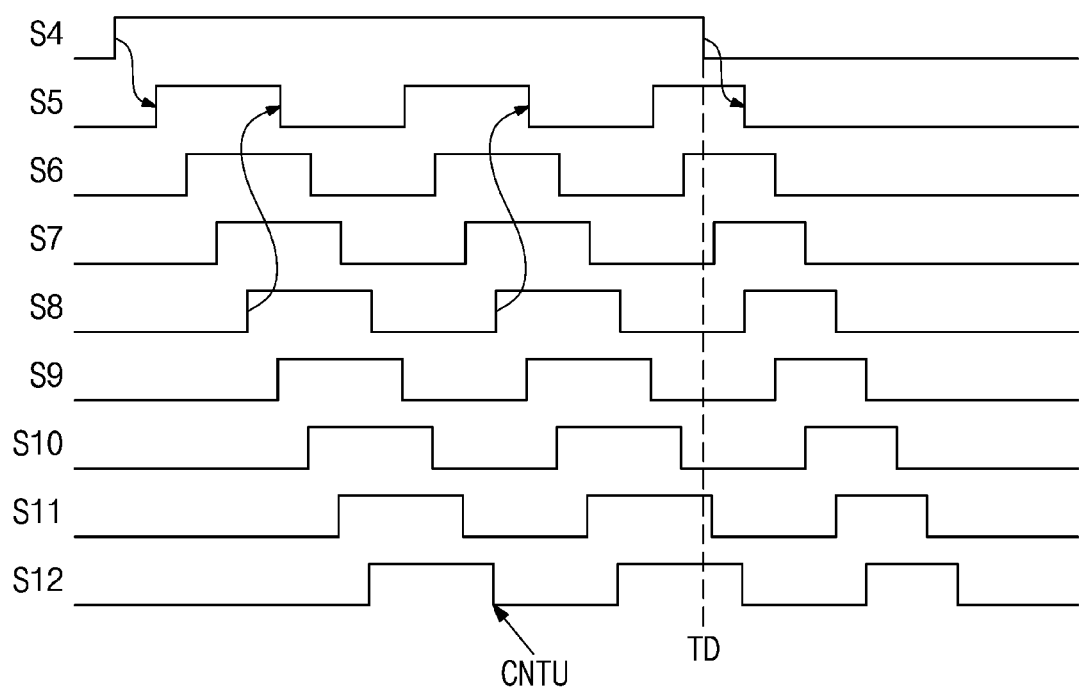
FIG. 8 illustrates examples of waveforms of signals when 24 delay cells operate, for describing the technical idea of the inventive concept more clearly.

FIG. 8 illustrates examples of waveforms of signals when 8 delay cells (e.g., 24 delay units "D") operate, for describing the technical idea of the inventive concept more clearly. Referring to FIGS. 2 and 8, it is assumed that the multi-stage unit interval detector 300 includes 8 delay cells. The first delay cell among the 8 delay cells may receive the fourth signal S4. It is assumed that 8 delay cells output fifth to twelfth signals S5 to S12.

The middle of the 8 delay cells, that is, an output of the fourth delay cell may be the eighth signal S8. It is assumed that the eighth signal S8 is fed back to the first delay unit D' of the first delay cell. Like the description given with reference to FIG. 7, the fifth to twelfth S5 to S12 may be in the form of a clock signal having a period shorter than a period of the fourth signal S4 and may be in the form of being sequentially delayed.

In some examples, when the inverter 350 exists, the counter 360 may perform a count-up operation CNTU in synchronization with a falling edge of the twelfth signal S12. Accordingly, at the decision time point TD, the first code CD[n:2] may indicate a value of "1". The first code CD[n:2] of "1" may mean that the rising edge of the fourth signal S4 passes through 1.5 times the 8 delay cells (e.g., 1 first delay units D' and 23 second delay units "D"), that is, passes through 36 delay units "D".

In some examples, when the inverter 350 does not exist, the counter 360 may perform the count-up operation CNTU in synchronization with the rising edge of the twelfth signal S12. Accordingly, at the decision time point TD, the first code CD[n:2] may indicate a value of "2". The first code CD[n:2] of "2" may mean that the rising edge of the fourth signal S4 passes through 2 times the 8 delay cells, that is, passes through the 48 delay units "D".

Herein, the first code CD[n:2] indicating a value of "1" or "2" may be expressed binary code with 3 bits.

In some embodiments, the counter 360 may receive the twelfth signal S12 and an inversion signal of the twelfth signal S12 and may perform a count-up operation in synchronization with the twelfth signal S12 and the inversion signal of the twelfth signal S12.

For example, when the fine code is selected among the fifth signal S5 through the eighth signal S8, the code [n:0] may be decided by using a counted value resulting from using the inversion signal of the twelfth signal S12. When the fine code is selected among the eighth signal S8 through the twelfth signal S12, the code [n:0] may be decided by using a counted value resulting from using the twelfth signal S12.

Although not illustrated, 8 decision blocks may detect the rising edge of the internal clock signal. As the feedback loop is formed by using the middle of the 8 delay cells (or the center of a delay loop), that is, by using the eighth signal S8, the period of the internal clock signal may be equal to a total delay amount of the 8 delay cells. Accordingly, at the decision time point TD, only one rising edge may be present in the 8 delay cells.

In other examples, 8 decision blocks may detect the falling edge of the internal clock signal when the inverter 350 does not exist.

In an embodiment, at the decision time point TD, as illustrated in FIG. 8, the seventh signal S7 may be at the high level, and the eleventh signal S11 may be at the low level. Accordingly, it may be determined that the rising edge of the internal clock signal is present in a delay cell outputting the seventh signal S7 and that the falling edge of the internal clock signal is present in a delay cell outputting the eleventh signal S11.

Figure 9:
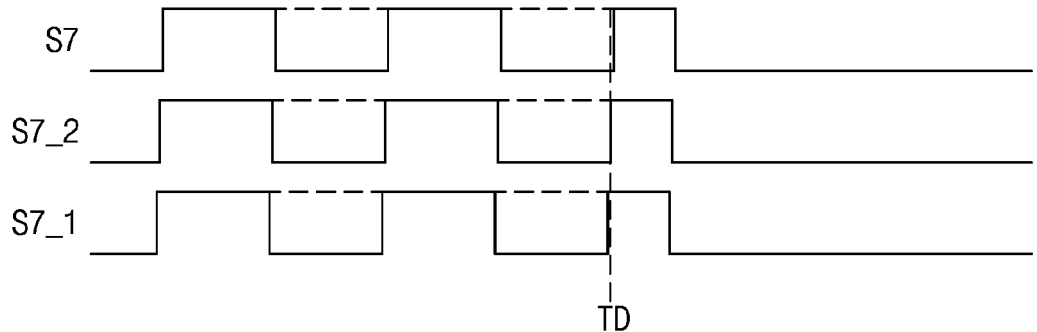
FIG. 9 illustrates an example of outputs of three second delay units of a delay cell outputting an eleventh signal.

FIG. 9 illustrates an example of outputs of three second delay units "D" of a delay cell outputting the eleventh signal S7. Referring to FIGS. 2, 8, and 9, the eleventh signal S7 may be an output of the second delay unit "D" that is third placed in the delay cell corresponding to the seventh signal S7. A 7_2-th signal S7_2 may be an output of the second delay unit "D" that is second placed in the delay cell corresponding to the seventh signal S7. The 7_2-th signal S7_2 may be advanced with respect to the seventh signal S7 as much as a delay amount of one second delay unit "D".

A 7_1-th signal S7_1 may be an output of the second delay unit "D" that is first placed in the delay cell corresponding to the seventh signal S7. The 7_1-th signal S7_1 may be advanced with respect to the 7_2-th signal S7_2 as much as a delay amount of one second delay unit "D".

At the decision time point TD, the 7_1-th signal S7_1 and the 7_2-th signal S7_2 are at the high level, and the seventh signal S7 is at the low level. Accordingly, it may be determined that the rising edge of the internal clock signal exists between the second delay unit "D" second placed and the second delay units "D" third placed.

Figure 10:
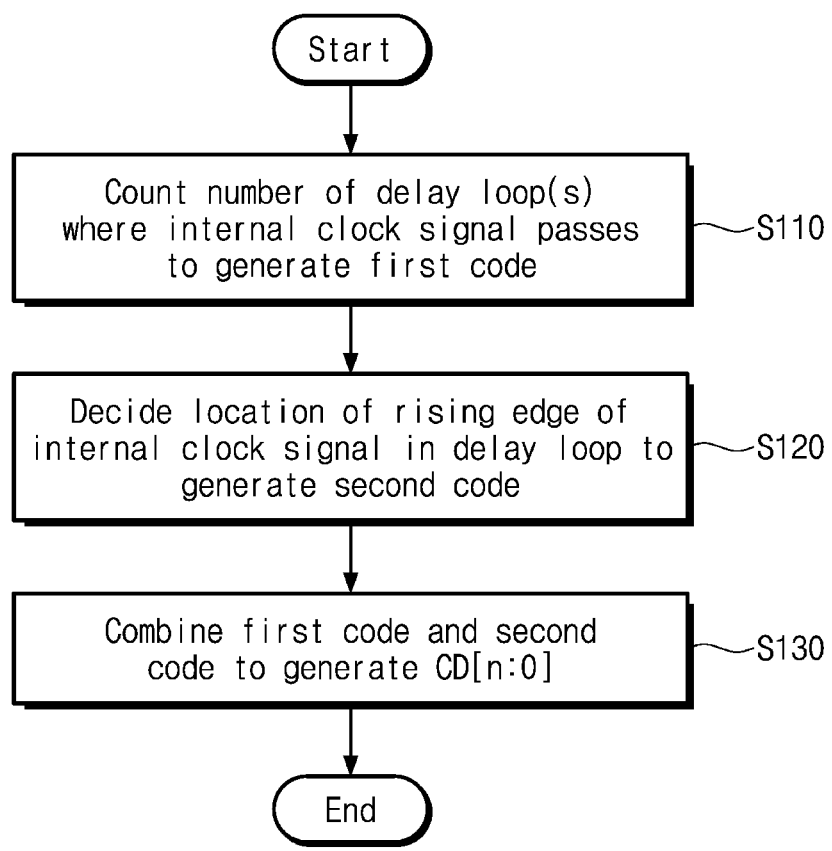
FIG. 10 illustrates an operating method of a multi-stage unit interval detector according to an embodiment of the inventive concept.

FIG. 10 illustrates an operating method of the multi-stage unit interval detector 300 according to an embodiment of the inventive concept. Referring to FIGS. 2 and 10, in operation S110, the multi-stage unit interval detector 300 may perform coarse detection in which the first code CD[n:2] is generated by counting the number of times that the internal clock signal passes through a delay loop.

In operation S120, the multi-stage unit interval detector 300 may decide a location of the rising edge of the internal clock signal within the delay loop and may generate the second code CD[1:0]. In operation S130, the multi-stage unit interval detector 300 may combine the first code CD[n:2] and the second code CD[1:0] to generate the code [n:0].

Figure 11:
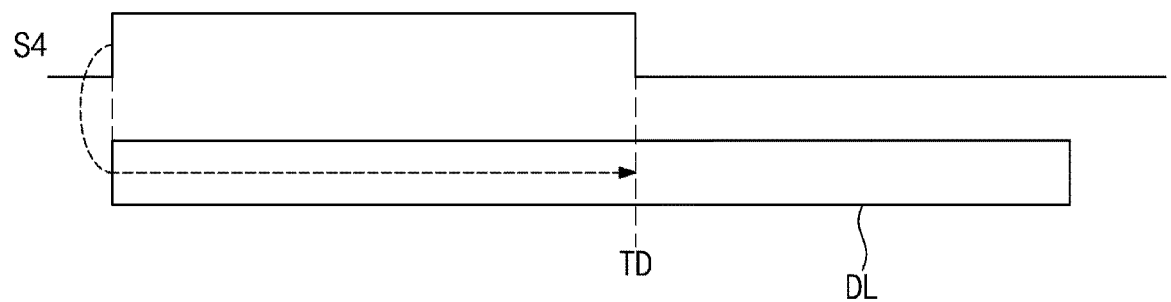
FIG. 11 conceptually illustrates a method of detecting a length of a high level interval of a fourth signal depending on a first example.

FIG. 11 conceptually illustrates a method of detecting a length of a high level interval of the fourth signal S4 depending on another example. Referring to FIG. 11, a delay loop DL may have a total delay amount greater than a length of a high level interval of the fourth signal S4 (e.g., a length of the unit interval UI). The length of the high level interval of the fourth signal S4 may be determined by inputting the fourth signal S4 to the delay loop DL and deciding a location on the delay loop DL, at which the rising edge of the fourth signal S4 is placed, in synchronization with the falling edge of the fourth signal S4.

According to the method of FIG. 11, the total delay amount of the delay loop DL may have to be longer than a length of the high level interval of the fourth signal S4. The C-PHY protocol defines to use a frequency within a range from 1 GHz to 6 GHz. Accordingly, the total delay amount of the delay loop DL may have to be longer than half a period of 1 GHz. The method of FIG. 11 requires overfull delay units in detection of the unit interval UI and is in problem of an increase in a size and costs.

Figure 12:
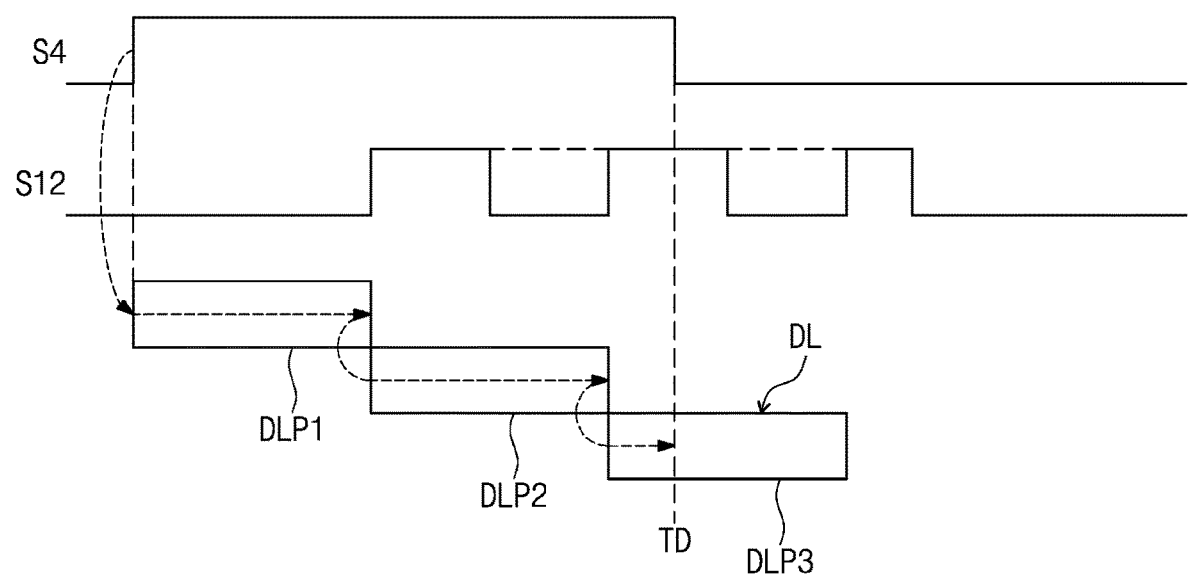
FIG. 12 conceptually illustrates a method of detecting a length of a high level interval of a fourth signal, according to according to an embodiment of the inventive concept.

FIG. 12 conceptually illustrates a method of detecting a length of a high level interval of the fourth signal S4, according to according to an embodiment of the inventive concept. Referring to FIG. 12, a total delay amount of the delay loop DL may be decided regardless of a length of a high level interval of the fourth signal S4 (i.e., a length of the unit interval UI).

An internal clock signal having a period shorter than a period of the fourth signal S4 may be generated from the fourth signal S4. The internal clock signal is input to the delay loop DL. The rising edge of the internal clock signal is output at the twelfth signal S12 may mean that the internal clock signal passes through the delay loop DL once. The delay loop DL through which the internal clock signal first passes may be a first delay loop DLP1.

The rising edge of the internal clock signal is second output at the twelfth signal S12 may mean that the internal clock signal passes through the delay loop DL once more. The delay loop DL through which the internal clock signal second passes may be a second delay loop DLP2. That is, the number of delay loops DLP1 and DLP2 through which the internal clock signal passes may be counted by counting edges of the internal clock signal output at the twelfth signal S12 until the decision time point TD.

The length of the high level interval of the fourth signal S4 may be decided by adding a total delay amount of the first and second delay loops DLP1 and DLP2 and a total delay amount on a third delay loop DLP3 associated with the rising edge of the internal clock signal during third delay loop DLP3. In an embodiment, the multi-stage unit interval detector 300 may determine a length of a longer unit interval by increasing a resolution of the counter 360 (i.e., the number of bits to be counted).

According to the inventive concept, a length of a unit interval may be determined by using a limited number of delay units, for example, delay units, of which a total delay amount is smaller than a length of the shortest unit interval defined in the C-PHY protocol. Accordingly, the number of delay units may be decreased, and the size and costs of the multi-stage unit interval detector 300 may decrease.

Figure 13:
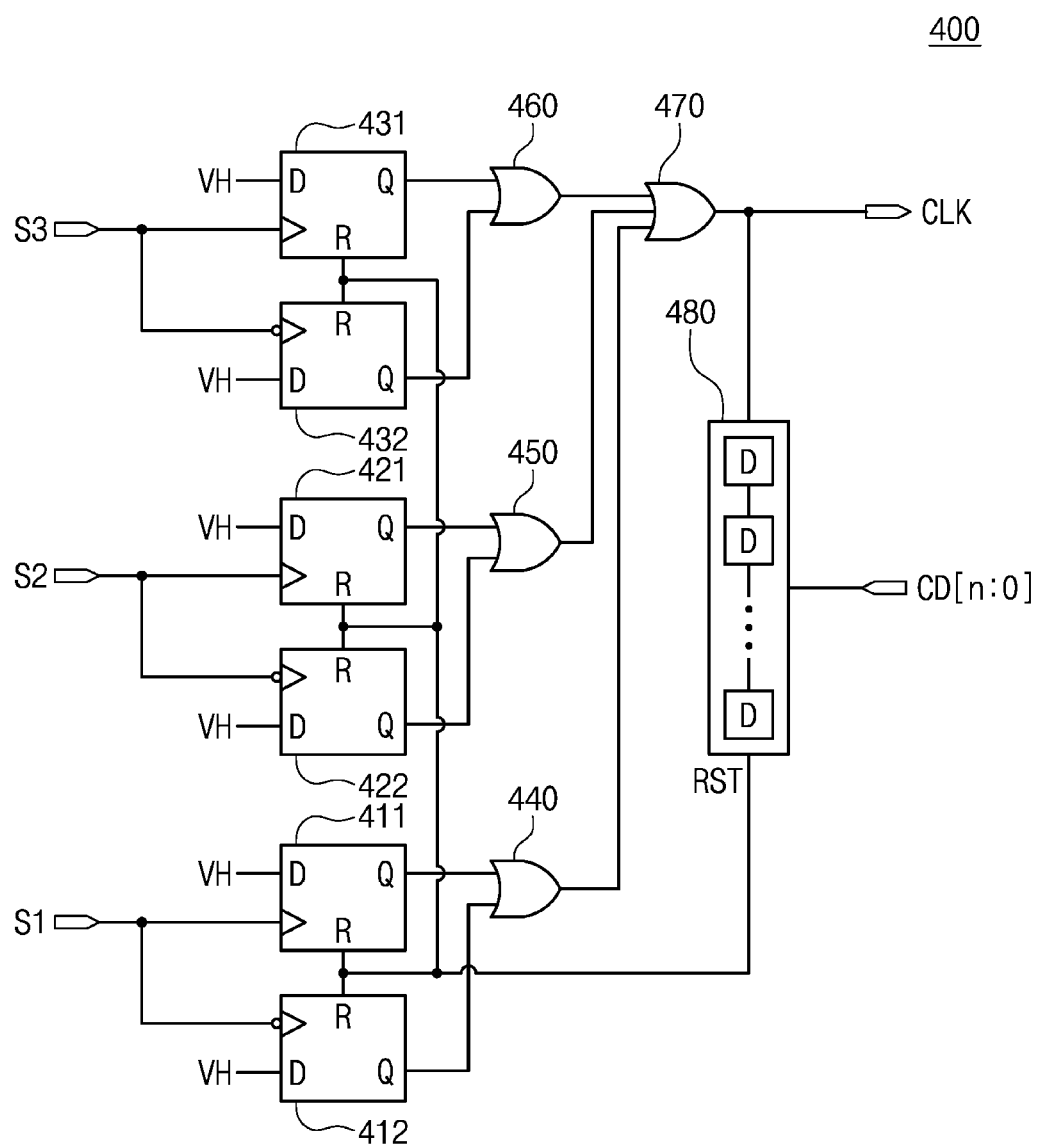
FIG. 13 illustrates a clock recovery circuit according to an embodiment of the inventive concept.

FIG. 13 illustrates a clock recovery circuit 400 according to an embodiment of the inventive concept. The clock recovery circuit 400 of FIG. 13 may be included in the clock recovery circuit 250 of FIG. 1. Referring to FIGS. 1 and 13, the clock recovery circuit 400 may include a logic circuit capable of generating the clock signal CLK based on a transition occurring at the first to third signals S1, S2, and S3. For example, the logic circuit may include first to sixth flip-flops 411, 412, 421, 422, 431, and 432 and first to fourth logic gates 440, 450, 460, and 470.

The first and second flip-flops 411 and 412 may output a logical value of logical high VH (e.g., a value of logic "1") in response to a transition of the first signal S1. The first logic gate 440 may combine outputs of the first and second flip-flops 411 and 412. Accordingly, the first logic gate 440 may output a value of logic "1" when the first signal S1 transitions.

The third and fourth flip-flops 421 and 422 may output a logical value of logical high VH (e.g., a value of logic "1") in response to a transition of the second signal S2. The second logic gate 450 may combine outputs of the third and fourth flip-flops 421 and 422. Accordingly, the second logic gate 450 may output a value of logic "1" when the second signal S2 transitions.

The fifth and sixth flip-flops 431 and 432 may output a logical value of logical high VH (e.g., a value of logic "1") in response to a transition of the third signal S3. The third logic gate 460 may combine outputs of the fifth and sixth flip-flops 431 and 432. Accordingly, the third logic gate 460 may output a value of logic "1" when the third signal S3 transitions.

The fourth logic gate 470 may combine outputs of the first, second, and third logic gates 440, 450, and 460. Accordingly, the fourth logic gate 470 may output a value of logic "1" in response to transitions occurring at the first, second, and third signals S1, S2, and S3. However, the fourth logic gate 470 may output a value of logic "1" in response to the first transition of the first, second, and third signals S1, S2, and S3 and may not be affected by a transition(s) following the first transition.

The fourth logic gate 470 may output the clock signal CLK that is generated by the first to sixth flip-flops 411, 412, 421, 422, 431, and 432 and the first to fourth logic gates 440, 450, 460, and 470. For example, a value of logic "1" of the clock signal CLK output from the fourth logic gate 470 may provide a first edge (e.g., a rising edge) of the clock signal CLK.

A delay circuit 480 may receive the clock signal CLK output from the fourth logic gate 470. The delay circuit 480 may delay the received signal to output a reset signal RST. The delay circuit 480 may receive the clock signal CLK and may include delay units "D" sequentially connected or sequentially arranged.

The first to sixth flip-flops 411, 412, 421, 422, 431, and 432 may be reset in response to the reset signal RST. As the first to sixth flip-flops 411, 412, 421, 422, 431, and 432 are reset, the first to fourth logic gates 440, 450, 460, and 470 may output values of logic "0". A value of logic "0" of the clock signal CLK output from the logic gate 470 may provide a second edge (e.g., a falling edge) of the clock signal CLK. Accordingly, the clock signal CLK may have the second edge in response to the reset signal RST.

A delay amount of the delay units "D" of the delay circuit 480 may be adjusted based on the code [n:0]. For example, each of the delay units "D" of the delay circuit 480 may have a delay amount equal to a delay amount of the first delay unit D' or the second delay unit "D" of FIG. 2. The code [n:0] may express ⅓ of the length of the unit interval UI with the number of delay cells. The delay circuit 480 may output the reset signal RST by delaying the clock signal CLK as much as a total delay amount of delay units "D" of the delay circuit 480.

A length of the unit interval UI determined from the multi-stage unit interval detector 300 (refer to FIG. 2) may be three times a total delay amount of the delay unit "D" of the delay circuit 480. Accordingly, a total delay amount of the delay circuit 480 may be ⅓ of the length of the unit interval UI. That is, a masking interval of 0.33 UI may be secured by the delay circuit 480.

Considering a delay amount of circuits for generating the clock signal CLK, the clock recovery circuit 400 may secure the masking interval of 0.35 UI. For example, the masking interval may be secured without separate components or circuits by setting a ratio of a delay amount of a delay cell in the multi-stage unit interval detector 300 and a delay amount of the delay circuit 480 in the clock recovery circuit 400 to 3:1.

In an embodiment, in the case of detecting the unit interval UI based on the method illustrated in FIG. 11, the number of delay units of the delay circuit 480 may be ⅓ of the number of delay units of the multi-stage unit interval detector 300. However, in the case of detecting the unit interval UI based on the method according to an embodiment of the inventive concept, the number of delay units of the delay circuit 480 may be more than ⅓ of the number of delay units of the multi-stage unit interval detector 300. In some embodiments, the number of delay units of the delay circuit 480 may be more than the number of delay units of the multi-stage unit interval detector 300.

Figure 14:
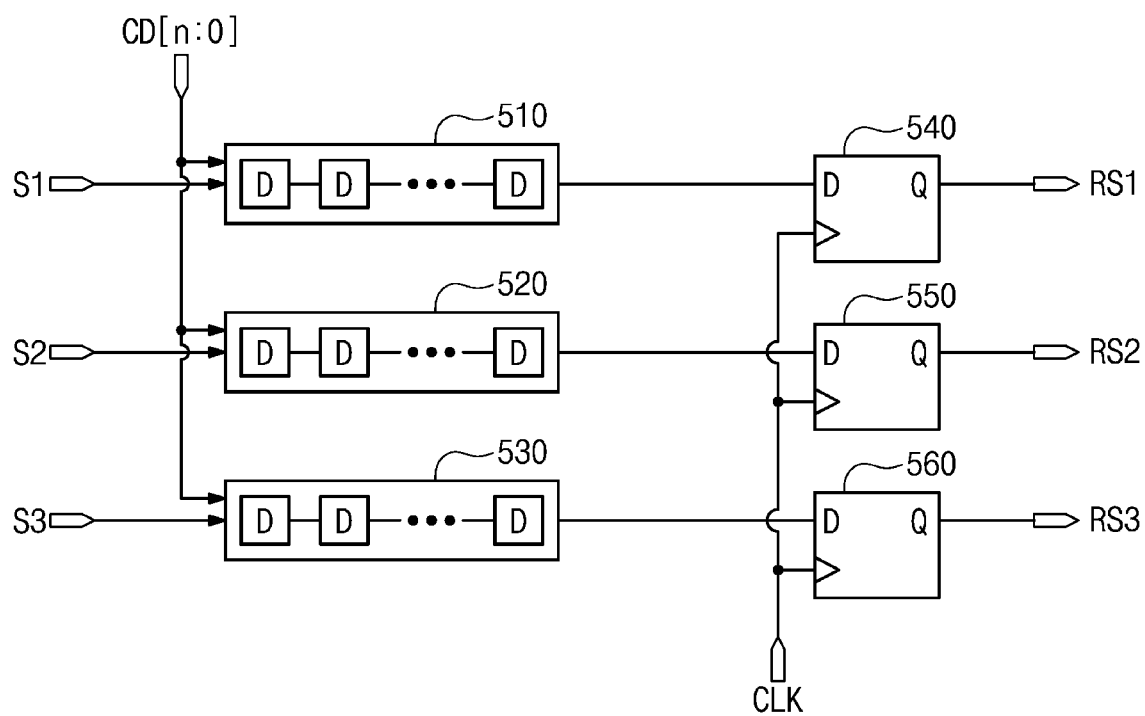
FIG. 14 illustrates a data recovery circuit according to an embodiment of the inventive concept.

FIG. 14 illustrates a data recovery circuit 500 according to an embodiment of the inventive concept. The data recovery circuit 500 of FIG. 14 may be included in the data recovery circuit 260 of FIG. 1. Referring to FIGS. 1 and 14, the data recovery circuit 500 may include first, second, and third delay circuits 510, 520, and 530 and first, second, and third flip-flops 540, 550, and 560.

The data recovery circuit 500 may delay the first, second, and third signals S1, S2, and S3 through the first, second, and third delay circuits 510, 520, and 530, respectively. Each of the first, second, and third delay circuits 510, 520, and 530 may include delay units "D". The first, second, and third delay circuits 510, 520, and 530 may delay the first, second, and third signals S1, S2, and S3 based on the code [n:0], respectively. The code [n:0] may express ⅓ of the length of the unit interval UI.

For example, each of the delay units "D" of the delay circuits 510, 520, and 530 may have a delay amount equal to a delay amount of the first delay unit D' or the second delay unit "D" of FIG. 2. The first, second, and third delay circuits 510, 520, and 530 may respectively delay the first, second, and third signals S1, S2, and S3 as much as a total delay amount of delay units "D", the number of which is equal to the number of delay cells indicated by the code [n:0]. Accordingly, a delay amount of each of the first, second, and third delay circuits 510, 520, and 530 may be ⅓ of the length of the unit interval UI.

The data recovery circuit 500 may include a logic circuit capable of generating the receive signals RS1, RS2, and RS3. For example, the logic circuit may include the first, second, and third flip-flops 540, 550, and 560. The first, second, and third flip-flops 540, 550, and 560 may receive the delayed first, second, and third signals S1, S2, and S3, respectively. Each of the first, second, and third flip-flops 540, 550, and 560 may receive the clock signal CLK from the clock recovery circuit 400.

Each of the first, second, and third flip-flops 540, 550, and 560 may operate in response to the clock signal CLK (e.g., in response to a first edge of the clock signal CLK). For example, the first, second, and third flip-flops 540, 550 and 560 may respectively latch the delayed first, second, and third signals S1, S2, and S3 in response to the clock signal CLK. As a result of the latch operation, the first, second, and third flip-flops 540, 550, and 560 may output the first, second, and third receive signals RS1, RS2, and RS3, respectively.

As described with reference to FIG. 13, the rising edge of the clock signal CLK is aligned with a start time point of the unit interval UI. In the data recovery circuit 500, each of the first, second, and third signals S1, S2, and S3 may be delayed as much as 0.35 UI or more.

Accordingly, the edge of the clock signal CLK may be aligned within a stable interval, not a change interval of the delayed first, second, and third signals S1, S2, and S3, and the first, second, and third receive signals RS1, RS2, and RS3 may be successfully latched.

As described with reference to FIG. 13, the number of delay units of each of the first, second, and third delay circuits 510, 520, and 530 may be more than ⅓ of the number of delay units of the multi-stage unit interval detector 300. In some embodiments, the number of delay units of each of the first, second, and third delay circuits 510, 520, and 530 may be more than the number of delay units of the multi-stage interval detector 300.

Figure 15:
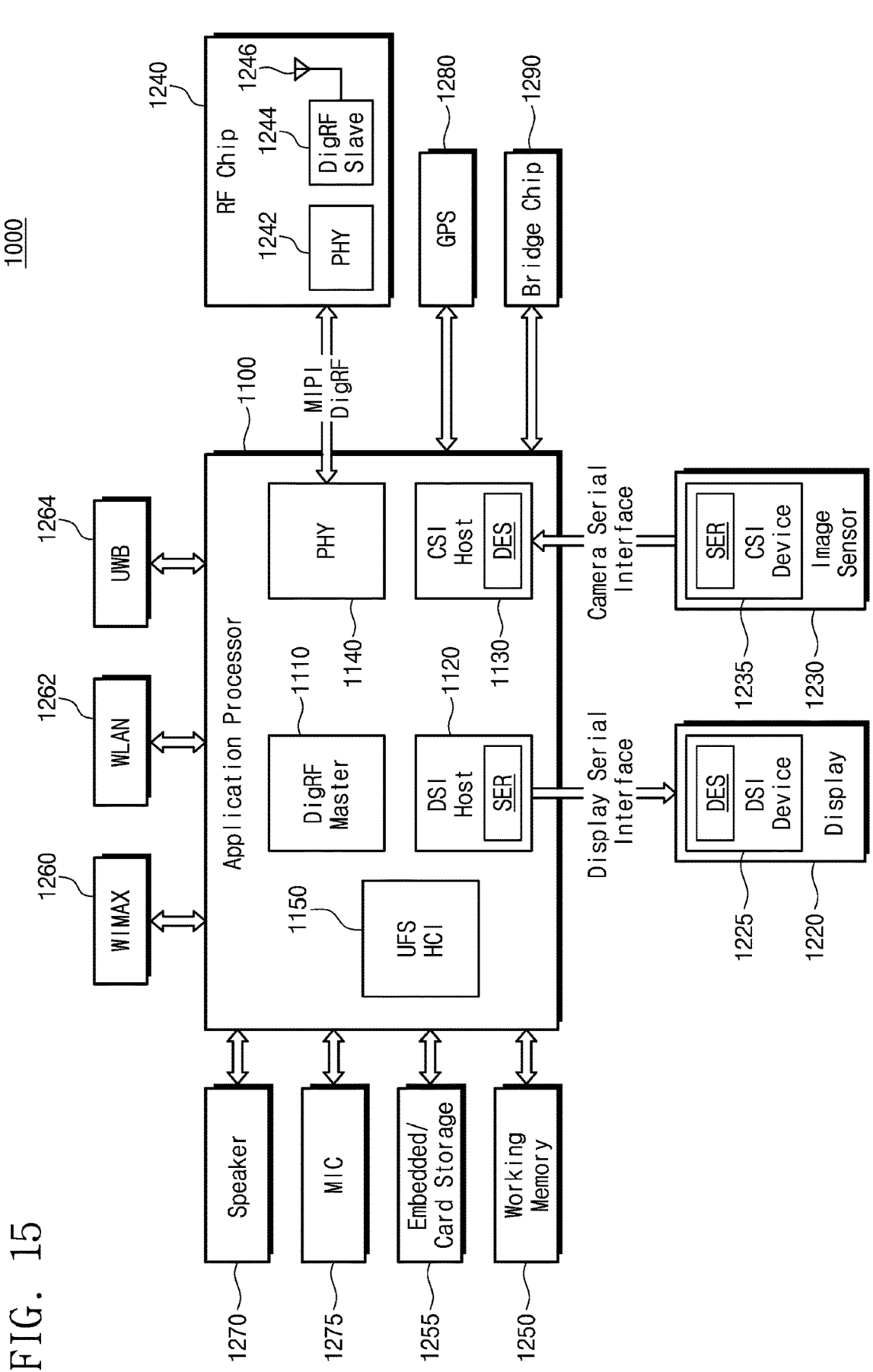
FIG. 15 is a block diagram illustrating an electronic device according to an embodiment of the inventive concept.

FIG. 15 illustrates an electronic device 1000 according to another embodiment of the inventive concept. The electronic device 1000 may be implemented with a data processing device that is capable of using or supporting an interface protocol proposed by the MIPI alliance. For example, the electronic device 1000 may be one of electronic devices such as a portable communication terminal, a personal digital assistant (PDA), a portable media player (PMP), a smartphone, a tablet computer, and a wearable device.

The electronic device 1000 may include an application processor 1100, a display 1220, and an image sensor 1230. The application processor 1100 may include a DigRF master 1110, a display serial interface (DSI) host 1120, a camera serial interface (CSI) host 1130, a physical layer 1140, and a universal flash storage host-controller interface (UFS HCI) 1150.

The DSI host 1120 may communicate with a DSI device 1225 of the display 1220 in compliance with the DSI. For example, a serializer SER may be implemented in the DSI host 1120, and a deserializer DES may be implemented in the DSI device 1225. For example, the DSI may use a physical layer that is defined in the C-PHY specification, and the DSI host 1120 may communicate with the DSI device 1225 through three or more communication lines. As described with reference to FIGS. 1 to 14, the DSI host 1120 and/or the DSI device 1225 may include delay cells including a feedback loop and may be configured to determine the unit interval UI through coarse detection and fine detection.

The CSI host 1130 may communicate with a CSI device 1235 of the image sensor 1230 in compliance with the CSI. For example, a deserializer DES may be implemented in the CSI host 1130, and a serializer SER may be implemented in the CSI device 1235. For example, the CSI may use a physical layer that is defined in the C-PHY specification, and the CSI host 1130 may communicate with the CSI device 1235 through three or more communication lines. As described with reference to FIGS. 1 to 14, the CSI host 1130 and/or the CSI device 1235 may include delay cells including a feedback loop and may be configured to determine the unit interval UI through coarse detection and fine detection.

The electronic device 1000 may further include a radio frequency (RF) chip 1240 that communicates with the application processor 1100. The RF chip 1240 may include a physical layer 1242, a DigRF slave 1244, and an antenna 1246. For example, the physical layer 1242 of the RF chip 1240 and the physical layer 1140 of the application processor 1100 may exchange data with each other in compliance with a DigRF interface proposed by the MIPI alliance. In some embodiments, in the case where the physical layers 1242 and 1140 communicate with each other through three or more communication lines, the physical layer 1242 and/or the physical layer 1140 may include delay cells including a feedback loop and may be configured to determine the unit interval UI through coarse detection and fine detection.

The electronic device 1000 may further include a working memory 1250 and an embedded/card storage device 1255. The working memory 1250 may temporarily store data processed or to be processed by the application processor 1100. The working memory 1250 may include a volatile memory such as a static random access memory (SRAM), a dynamic RAM (DRAM), or a synchronous DRAM (SDRAM), and/or a nonvolatile memory such as a flash memory, a phase-change RAM (PRAM), a magneto-resistive RAM (MRAM), a resistive RAM (ReRAM), or a ferroelectric RAM (FRAM).

The embedded/card storage device 1255 may store data provided from the application processor 1100 or may provide the stored data to the application processor 1100. The embedded/card storage device 1255 may include a nonvolatile memory that stores data regardless of whether a power is supplied thereto.

For example, the embedded/card storage device 1255 may communicate with the application processor 1100 in compliance with the UFS communication protocol. In this example, the application processor 1100 may process communication with the embedded/card storage device 1255 through the UFS HCI 1150. In some embodiments, in the case where the embedded/card storage device 1255 communicates with the application processor 1100 through three or more communication lines, the embedded/card storage device 1255 and/or the application processor 1100 may include delay cells including a feedback loop and may be configured to determine the unit interval UI through coarse detection and fine detection.

The electronic device 1000 may communicate with an external device/system through communication modules, such as a worldwide interoperability for microwave access (WiMAX) 1260, a wireless local area network (WLAN) 1262, and an ultra-wideband (UWB) 1264. The electronic device 1000 may further include a speaker 1270 and a microphone 1275, which are used to process voice information. The electronic device 1000 may further include a global positioning system (GPS) device 1280 for processing position information. The electronic device 1000 may further include a bridge chip 1290 for managing connection with peripheral devices.

In the above embodiments, components according to the inventive concept are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concept, coarse detection and fine detection are performed by using a decreased number of delay units, and a unit interval of received signals is determined by combining results of the coarse detection and the fine detection. Accordingly, an electronic device recovering a clock signal by using a decreased number of delay units and an operating method of the electronic device are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic device comprising:
   a unit interval detector including a plurality of delay cells and configured to receive a first signal, a second signal, and a third signal and to detect a code indicating a unit interval from the first signal, the second signal, and the third signal;
   a clock recovery circuit configured to generate a clock signal from the first signal, the second signal, and the third signal in response to the code; and
   a data recovery circuit configured to generate a first receive signal, a second receive signal, and a third receive signal from the first signal, the second signal, and the third signal in response to the code and the clock signal,
   wherein a total delay amount of the delay cells is smaller than a length of the unit interval, and
   wherein the unit interval detector is configured to perform a multi-stage detection operation including coarse detection and fine detection by using the delay cells.

2. The electronic device of claim 1, wherein the unit interval detector is further configured to:
   generate a fourth signal from the first signal, the second signal, and the third signal, half a period of the fourth signal being equal to the length of the unit interval,
   generate an internal clock signal from the delay cells in response to the fourth signal, the internal signal having a period shorter than a period of the fourth signal, and
   perform the coarse detection by counting a number of times of a toggle of the internal clock signal while the fourth signal is at a high level.

3. The electronic device of claim 2, wherein the unit interval detector is further configured to either:
   perform the fine detection by detecting a location of a rising edge of the internal clock signal at a falling edge of the fourth signal, or
   perform the fine detection by detecting a location of a falling edge of the internal clock signal at the falling edge of the fourth signal.

4. The electronic device of claim 1, wherein the delay cells include first delay cells receiving the fourth signal and second delay cells of a rear stage of the first delay cells, and
   wherein an output of the first delay cells is fed back to a first delay cell first placed from among the first delay cells through an inverter.

5. The electronic device of claim 4, wherein a delay unit of the first delay cell is configured to output a low level while the fourth signal is at a high level and the output of the inverter is at a low level.

6. The electronic device of claim 1, wherein each of the delay cells includes three first delay units,
   wherein the unit interval detector detects a first code through the coarse detection, and
   wherein the unit interval detector detects a second code through the fine detection.

7. The electronic device of claim 6, wherein the clock recovery circuit includes second delay units,
   wherein the clock recovery circuit is configured to:
   allow the clock signal to transition at a first time point when one of the first signal, the second signal, and the third signal transitions; and
   maintain a level of the clock signal during a period of time corresponding to a total delay amount of delay units, a number of which corresponds to a sum of a first number and a second number, from among the second delay units,
   wherein the first number is a result of multiplying a number of the first delay units of the delay cells and a value of the first code together, and
   wherein the second number is a value which the second code indicates.

8. The electronic device of claim 7, wherein the number of the second delay units is more than ⅓ of the number of the first delay units of the delay cells.

9. The electronic device of claim 6, wherein the data recovery circuit includes second delay units,
   wherein the data recovery circuit is configured to:
   delay the first signal, the second signal, and the third signal as much as a total delay amount of delay units, a number of which corresponds to a sum of a first number and a second number, from among the second delay units; and
   latch the first signal, the second signal, and the third signal in synchronization with the clock signal,
   wherein the first number is a result of multiplying a number of the first delay units of the delay cells and a value of the first code together, and
   wherein the second number is a value which the second code indicates.

10. The electronic device of claim 9, wherein the number of the second delay units is more than ⅓ of the number of the first delay units of the delay cells.

11. The electronic device of claim 1, wherein the first signal, the second signal, and the third signal are received in compliance with a protocol of a C-PHY.

12. The electronic device of claim 1, wherein the unit interval detector further includes:

a logic gate configured to generate the fourth signal by performing an exclusive OR operation on the first signal, the second signal, and the third signal;

a feedback loop configured to input an output of first delay cells of the delay cells to a first delay unit of the first delay cells and to generate an internal clock signal;

a counter configured to output a result of the coarse detection by performing a count operation in synchronization with an output of second delay cells following the first delay cells from among the delay cells;

first decision blocks configured to detect either a rising or a falling edge of the internal clock signal from the first delay cells;

second decision blocks configured to detect either a rising or a falling edge of the internal clock signal from the second delay cells; and an encoder configured to encode decision results of the first decision blocks and the second decision blocks and to output a result of the fine detection.

13. An electronic device comprising:

a first delay cell including a first delay unit and at least one second delay unit sequentially connected, and configured to receive a first signal being toggled between a high level and a low level and to delay the first signal so as to be output as a second signal;

a second delay cell including at least two third delay units sequentially connected, and configured to receive the second signal from the first delay cell and to delay the second signal so as to be output as a third signal;

a counter configured to perform a count operation in synchronization with the third signal and to output a first code as a result of the count operation;

a first decision block connected to the first delay cell, and configured to detect, in synchronization with a falling edge of the first signal, either a rising or a falling edge of a first internal signal from the first delay cell and to output a first bit as a detection result of either the rising or the falling edge of the first internal signal;

a second decision block connected to the second delay cell, and configured to detect, in synchronization with a falling edge of the first signal, either a rising or a falling edge of a second internal signal from the second delay cell and to output a second bit as a detection result of either the rising or the falling edge of the second internal signal; and an encoder configured to generate a second code from the first bit and the second bit, wherein the second signal is fed back to the first delay unit through an inverter.

14. The electronic device of claim 13, wherein the first code and the second code form a third code indicating a length of an interval where the first signal is at a high level, wherein the first code includes a most significant bit of bits of the third code, and wherein the second code includes a least significant bit of the bits of the third code.

15. The electronic device of claim 13, wherein the counter is configured to perform a count operation while the first signal is at the high level.

16. The electronic device of claim 13, wherein the first delay unit outputs a low level when the first signal is at the first high level and the second signal is at a high level.

17. The electronic device of claim 13, further comprising:

a logic gate configured to receive a fourth signal, a fifth signal, and a sixth signal and to generate the first signal by performing an exclusive OR operation on the fourth signal, the fifth signal, and the sixth signal.

18. An operating method of an electronic device, comprising:

receiving a first signal being toggled between a high level and a low level;

in response to the first signal, generating a second signal being toggled between the high level and the low level at a period shorter than a period of the first signal;

counting a number of times that the second signal passes through a delay loop including first delay cells and second delay cells while the first signal is at the high level and generating a first code as a result of the counting;

detecting a location on the delay loop, at which either a rising or a falling edge of the second signal exists, in synchronization with a falling edge of the first signal and generating a second code as a result of the detecting; and combining the first code and the second code and generating a third code as a result of the combining.

19. The operating method of claim 18, wherein the generating of the second signal includes:

adjusting the second signal to the low level while the first signal is at the high level and an output signal of the first delay cells is at the low level.

20. The operating method of claim 18, further comprising:

receiving a third signal, a fourth signal, and a fifth signal and generating the first signal by performing an exclusive OR operation on the third signal, the fourth signal, and the fifth signal; and allowing a clock signal to transition as one of the third signal, the fourth signal, and the fifth signal transitions and maintaining a level of the clock signal in response to the third code.

* * * * *